United States Patent
Rane et al.

(10) Patent No.: US 10,128,804 B2
(45) Date of Patent: Nov. 13, 2018

(54) TEMPERATURE-COMPENSATED EQUALIZER

(71) Applicant: TEXAS INSTRUMENTS INCORPORATED, Dallas, TX (US)

(72) Inventors: Amit Rane, Santa Clara, CA (US); Dongwei Chen, Pleasanton, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/394,931

(22) Filed: Dec. 30, 2016

(65) Prior Publication Data
US 2018/0191321 A1    Jul. 5, 2018

(51) Int. Cl.
| | |
|---|---|
| *H03F 3/45* | (2006.01) |
| *H03G 1/00* | (2006.01) |
| *H03G 3/30* | (2006.01) |
| *H03F 1/32* | (2006.01) |

(52) U.S. Cl.
CPC ......... *H03G 1/007* (2013.01); *H03F 3/45071* (2013.01); *H03G 3/3089* (2013.01); *H03F 1/3211* (2013.01); *H03F 3/45479* (2013.01); *H03G 2201/708* (2013.01)

(58) Field of Classification Search
CPC .... H03F 1/30; H03F 3/45; H03F 2203/45284; H03F 3/45479; H03F 3/45071; H03F 3/45085; H03G 1/0023; H03G 1/0029; H03G 1/0035; H03G 1/0088; H03G 3/00

USPC ................................................ 330/254, 256
See application file for complete search history.

(56) References Cited

U.S. PATENT DOCUMENTS

| | | | | |
|---|---|---|---|---|
| 5,384,501 A | * | 1/1995 | Koyama | G06G 7/184 330/300 |
| 6,316,997 B1 | * | 11/2001 | Tammone, Jr. | H03G 1/0029 330/254 |
| 7,215,196 B2 | * | 5/2007 | Banba | H03F 3/45085 330/254 |
| 7,782,136 B2 | * | 8/2010 | Kocaman | H03F 3/45183 330/254 |
| 7,889,006 B1 | * | 2/2011 | Jones | H03F 3/45098 330/254 |
| 2010/0123521 A1 | * | 5/2010 | Bach | H03F 3/45179 330/254 |

* cited by examiner

*Primary Examiner* — Khanh V Nguyen
(74) *Attorney, Agent, or Firm* — John R. Pessetto; Charles A. Brill; Frank D. Cimino

(57) ABSTRACT

An equalizer, in at least some embodiments, comprises an amplifier configured to produce an amplified voltage signal that is a function of an ambient temperature affecting the equalizer. The equalizer also includes a linear equalizer stage coupled to the amplifier and comprising a transistor having a resistance controlled by the amplified voltage signal. The linear equalizer stage is configured to produce a voltage output signal having a gain that is dependent on the transistor resistance and on a frequency of the amplified voltage signal.

16 Claims, 3 Drawing Sheets

TEMPERATURE-COMPENSATED EQUALIZER

BACKGROUND

Equalizers are circuits that are configured to boost (i.e., apply a positive gain to) certain frequencies in a signal and to cut (i.e., apply a negative gain to) other frequencies in the signal. They are often deployed in high-speed data links, such as in Ethernet applications. In many cases, they are deployed in high-temperature environments, such as in data centers and server rooms. Such high temperatures may increase channel data loss. In addition, high temperatures may affect an equalizer's ability to properly equalize signals. An equalizer that is capable of accounting for such temperature fluctuations by adjusting gain as a function of temperature is desirable.

SUMMARY

An equalizer, in at least some embodiments, comprises an amplifier configured to produce an amplified voltage signal that is a function of an ambient temperature affecting the equalizer. The equalizer also includes a linear equalizer stage coupled to the amplifier and comprising a transistor having a resistance controlled by the amplified voltage signal. The linear equalizer stage is configured to produce a voltage output signal having a gain that is dependent on the transistor resistance and on a frequency of the amplified voltage signal. One or more such embodiments may be supplemented using one or more of the following concepts, in any order and in any combination: wherein the amplifier comprises an operational amplifier having a digitally controllable input voltage reference signal; wherein the amplifier includes a digitally controllable feedback loop resistance; wherein the transistor comprises an n-type MOSFET; wherein the amplified voltage signal is provided to a source of the transistor, and wherein a gate of the transistor is digitally controllable; further comprising a first capacitor coupled to a source of the transistor and a second capacitor coupled to a drain of the transistor; further comprising a first bipolar junction transistor (BJT) coupled to the first capacitor via an emitter of the first BJT, and further comprising a second BJT coupled to the second capacitor via another emitter of the second BJT; wherein the voltage output signal is produced across the collectors of the first and second BJTs; wherein, when a gate-to-source voltage between a gate and a source of the transistor is zero, the gain becomes independent of the frequency and the transistor resistance; wherein, when the gate-to-source voltage is zero, the gain is a ratio of a first resistor to a second resistor, the first resistor coupled to a collector of a bipolar junction transistor (BJT) and the second resistor coupled to an emitter of the BJT; wherein, when a gate-to-source voltage between a gate and a source of the transistor is at least a predetermined amount so that the transistor is fully on, the gain becomes independent of the transistor resistance; wherein, when the gate-to-source voltage is at least the predetermined amount, the gain is a ratio of: the resistance of a first resistor coupled to a collector of a bipolar junction transistor in the linear equalizer stage; and the combination of the resistance of a second resistor coupled to an emitter of the BJT and an impedance of a capacitor coupled to the emitter.

At least some embodiments are directed to an equalizer, comprising an operational amplifier having a first input node, a second input node, an output node, and a feedback loop between the output node and the first input node, the first input node comprising a first resistor and receiving a first voltage signal dependent on an ambient temperature affecting the equalizer, the second input node receiving a digitally controllable reference voltage signal, the feedback loop comprising a second resistor having a digitally controllable resistance, and the output node carrying an amplified voltage signal that is a function of the ambient temperature. The equalizer also comprises a metal oxide semiconductor field effect transistor (MOSFET) having a digitally controllable gate voltage signal and a source coupled to a first bias resistor and to a first capacitor, the first capacitor coupled to the emitter of a first bipolar junction transistor (BJT), to a first bias current source, and to a third resistor, the MOSFET further comprising a drain coupled to a second bias resistor and to a second capacitor, the second capacitor coupled to the emitter of a second BJT, to a second bias current source, and to a fourth resistor. The collectors of the first and second BJTs couple to fifth and sixth resistors, respectively. The amplified voltage signal controls a resistance of the MOSFET, and the resistance of the MOSFET affects a gain of the equalizer. One or more such embodiments may be supplemented using one or more of the following concepts, in any order and in any combination: wherein the MOSFET is an n-type MOSFET; wherein, when a gate-to-source voltage between a gate of the MOSFET and the source of the MOSFET is zero, the MOSFET is off and the gain is determined based on resistances of at least one of the third and fourth resistors and based on resistances of at least one of the fifth and sixth resistors; wherein, when the MOSFET is fully on, the gain is determined based on resistances of at least one of the third and fourth resistors, on resistances of at least one of the fifth and sixth resistors, and on an impedance provided by at least one of the first and second capacitors in response to the frequency of the amplified voltage signal; when the MOSFET is partially on, the gain is determined based on resistances of at least one of the third and fourth resistors, on resistances of at least one of the fifth and sixth resistors, on an impedance provided by at least one of the first and second capacitors in response to the frequency of the amplified voltage signal, and on a resistance of the MOSFET.

At least some embodiments are directed to a method, comprising providing an input voltage signal dependent on an ambient temperature, amplifying the input voltage signal with an operational amplifier to produce an amplified voltage signal, providing the amplified voltage signal to a source of a metal oxide semiconductor field effect transistor (MOSFET), and providing a gate voltage signal to a gate of the MOSFET. The method includes, when the MOSFET is fully on, providing a first gain to the amplified voltage signal that is based on a frequency of the amplified voltage signal. The method includes, when the MOSFET is partially on, providing a second gain to the amplified voltage signal that is based on a frequency of the amplified voltage signal and on a resistance of the MOSFET. The method includes, when the MOSFET is off, providing a third gain to the amplified voltage signal that is independent of the frequency of the amplified voltage signal and of the resistance of the MOSFET. One or more such embodiments may be supplemented using one or more of the following concepts, in any order and in any combination: wherein providing the first and second gains comprises using a first capacitor coupled to the source of the MOSFET and using a second capacitor coupled to a drain of the MOSFET; wherein the MOSFET is an n-type MOSFET.

BRIEF DESCRIPTION OF THE DRAWINGS

For a detailed description of various examples, reference will now be made to the accompanying drawings in which.

DETAILED DESCRIPTION

At least some embodiments are directed to a linear equalizer that is capable of producing a signal gain that is a function of the variable resistance of a transistor and the frequency of an input signal. The resistance of the transistor, in turn, is controlled by a voltage level of the input signal, and the voltage level of the input signal depends at least in part on an ambient temperature affecting the equalizer. Thus, in effect, the linear equalizer is configured to adjust its gain depending on the frequency of the input signal as well as the ambient temperature. Embodiments of this equalizer help to mitigate the deleterious effects of high and/or fluctuating ambient temperatures.

Figure 1:
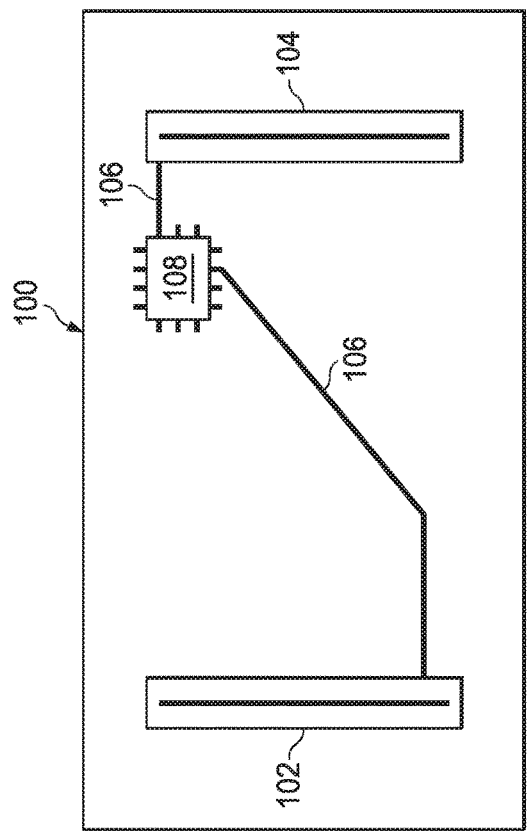
FIG. 1 is a top-down view of an electronic device backplane with a chip containing the equalizer disclosed herein.

FIG. 1 is a top-down view of an electronic device backplane 100 (e.g., a server backplane). The backplane 100 is one illustrative application for the equalizer circuit disclosed herein. The scope of application, however, is not limited to backplanes or any other type of electronic device(s). The backplane 100 may comprise connectors 102 and 104 to which other electrical devices—for instance, printed circuit board (PCB) cards—may couple. Two connectors are depicted for simplicity, but in some embodiments, the backplane 100 may include up to one dozen connectors or more. The connectors 102 and 104 may couple to each other or to other circuitry—such as illustrative circuitry 108—using metal (e.g., copper) traces, such as illustrative metal trace 106. Although equalizers are commonly used in backplanes, the temperature-compensated equalizer circuit described herein is particularly useful when the metal trace 106 is relatively lengthy because signals carried on long traces may be particularly susceptible to the deleterious effects of high ambient temperatures in the backplane environment.

Figure 2:
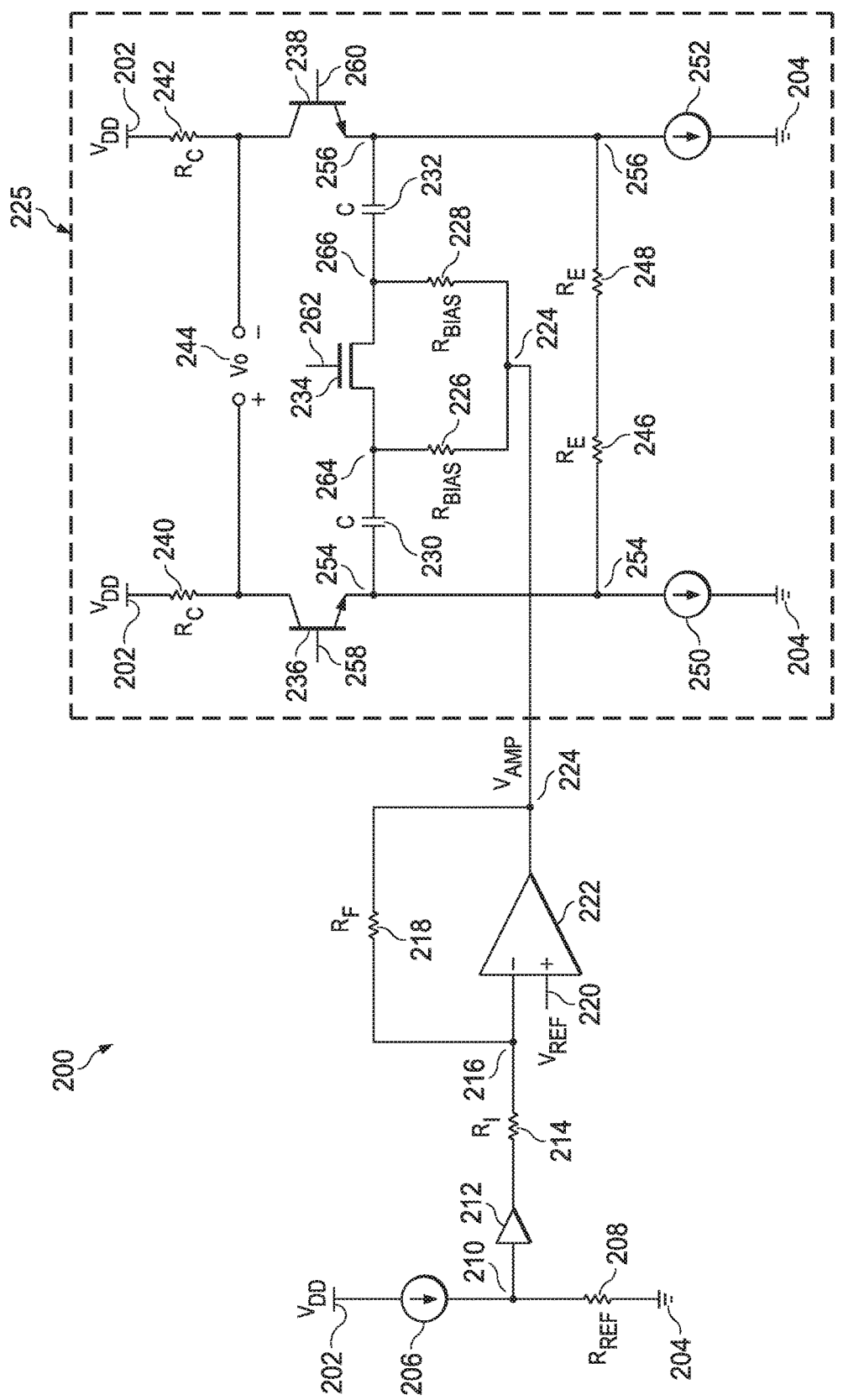
FIG. 2 is a circuit schematic diagram of the equalized described herein.

FIG. 2 is a circuit schematic diagram of a temperature-compensated equalizer 200 in accordance with various embodiments. The equalizer 200 comprises a voltage supply rail ($V_{DD}$) 202 and ground connections 204. The equalizer 200 also includes a current 206 (or current input) which, for simplicity's sake, is represented as a current source but may in at least some embodiments be a current received from another circuit or electronic device. In at least some embodiments, for example, the current 206 is produced by a circuit that is configured to produce currents that are indicative of the ambient temperature. Such circuits may produce stronger currents when the ambient temperature is higher and weaker currents when the ambient temperature is lower (or vice versa). Such circuits for producing ambient-temperature-dependent currents are known in the art (e.g., TEXAS INSTRUMENTS® LM134).

The equalizer 200 additionally includes a resistor ($R_{REF}$) 208 (e.g., 10 kOhms) coupled to a node 210 and to ground 204. The node 210 couples to a buffer 212, which, in turn, couples to a resistor ($R_I$) 214 (e.g., 10 kOhms). The resistor 214 couples to a node 216, which is one of the two inputs to operational amplifier 222. The node 216 is shown as coupling to the inverting input of the amplifier 222, but the scope of disclosure is not limited as such. The amplifier 222 also receives a second input at node 220. The input at node 220 is a digitally controllable voltage reference signal $V_{REF}$. The amplifier 222 generates an amplified voltage signal ($V_{AMP}$) at node 224. The node 224 couples to node 216 via a feedback loop that contains a resistor ($R_F$) 218 (e.g., digitally programmable between 6-192 kOhms). The amplified voltage signal provided by the operational amplifier 222 at node 224 is expressed as follows:

$$VAMP = \frac{(V_{REF} - V_{INPUT})R_F}{R_I} \quad (1)$$

where $V_{AMP}$ is the amplified voltage signal at node 224, $V_{REF}$ is the voltage reference signal provided at node 220, $V_{INPUT}$ is the input voltage signal provided at node 216, $R_F$ is the resistance of the resistor 218, and $R_I$ is the resistance of the resistor 214.

The equalizer 200 also comprises a linear equalizer stage (LES) 225. The LES 225 may be composed of a differential circuit with identical, opposing components in each half of the differential circuit. More specifically, a first side of the LES 225 may include a $V_{DD}$ connection 202; a resistor ($R_C$) 240 (e.g., 80 Ohms); a bipolar junction transistor (BJT) 236 having a base 258 coupled to the negative input signal of the chip for which equalization is desired. The collector of the BJT 236 couples to the resistor 240, and the emitter of the BJT 236 couples to a node 254. The node 254 couples to a capacitor (C) 230 (having a capacitance selected based on a target boost frequency—e.g., 0.16 pF), which, in turn, couples to a transistor source 264. Node 254 additionally couples to a resistor ($R_E$) 246, and to a bias current source 250 (e.g., 2.5 mA). The bias current source 250 couples to the ground connection 250.

The LES 225 further comprises the $V_{DD}$ 202 connection; a resistor (RC) 242 (e.g., 80 Ohms); a BJT 238 having a collector that couples to the resistor 242, a base 260 coupled to the positive input signal of the chip for which equalization is desired, and an emitter that couples to node 256. The node 256 further couples to a capacitor (C) 232 (having a capacitance selected based on a target boost frequency—e.g., 0.16 pF). The capacitors 230 and 232 couple to a transistor (e.g., n-type or p-type metal oxide semiconductor field effect transistor (MOSFET)) 234. In some embodiments, the source of the transistor 234 may couple to capacitor 230 and the drain may couple to capacitor 232. In other embodiments, the source of the transistor 234 may couple to the capacitor 232 and the drain of the transistor 234 may couple to capacitor 230. The source and drain terminals of transistor 234 may be more generally referred to as current conduction terminals.

The transistor 234 has a gate 262 via which the transistor is controlled. The source 264 and drain 266 couple to node 224 via bias resistors ($R_{BIAS}$) 226 (e.g., 10 kOhms) and 228 (e.g., 10 kOhms), respectively. The resistance values of the bias resistors 226 and 228 are selected so as to achieve desired responses from the transistor 234. The node 256 further couples to a resistor ($R_E$) 248 (e.g., 180 Ohms), which couples in series with resistor 246. The node 256 further couples to a bias current source 252 (e.g., 2.5 mA), and the bias current source 252 couples to ground 204. The values for the bias current sources 250 and 252 are selected so as to achieve desired responses from the BJTs 236, 238. The output voltage $V_O$ of the LES 225 is produced across the collectors of BJTs 236 and 238, as numeral 244 indicates.

In operation, the amplifier 222 receives at its input node 216 an input voltage signal that indicates the ambient temperature affecting the equalizer 200. The amplifier 222 uses the voltage reference signal at node 220 to produce an amplified voltage signal ($V_{AMP}$) at the node 224. Because $V_{AMP}$ is an amplified version of the input voltage signal received via node 216, $V_{AMP}$—like the input voltage signal at node 216—reflects the ambient temperature affecting the equalizer 200. Stated another way, the signal $V_{AMP}$ is a function of the ambient temperature, so when the ambient temperature changes, the signal $V_{AMP}$ also changes.

The $V_{AMP}$ signal is provided to the node 224, and its voltage is applied to the source and drain of the transistor 234 through resistors 226, 228. The gate-to-source voltage between the gate 262 and the source 264 controls the flow of current through the transistor 234, and, therefore, controls the resistance of the transistor 234. Thus, the voltages applied to the gate 262 and source 264 control the resistance of the transistor 234, and because the voltage at the source 264 is a function of the ambient temperature, the resistance of the transistor 234 is a function of the ambient temperature.

The voltage applied at gate 262 is digitally controlled and functions as an ON/OFF switch for the equalizer's temperature-compensating boost functionality. When the voltage applied to gate 262 is high (e.g., 1.2 V), the boost functionality of the equalizer circuit 200 is turned ON. When the voltage applied to the gate 262 is low (e.g., 0 V), the boost functionality is OFF. Accordingly, the parameters for the circuit (e.g., resistances for resistors 208, 214, 218, 226, and 228) are chosen so that the difference between the voltage at the gate 262 (e.g., 1.2 V or 0 V) and the voltage at the source 264 (dependent on ambient temperature) causes a desired resistance to be provided by the transistor 234. The desired resistance, in turn, provides the desired gain of the LES 225 as a function of ambient temperature.

In some instances, for example, the gate voltage and the source voltage may be identical (e.g., both may be 1.2 V). In this case, because there is no potential between gate 262 and source 264, the transistor 234 is completely OFF. When the transistor 234 is completely off, the gain of the LES 225 is determined based on the resistances of resistors $R_C$ 240, 242 and $R_E$ 246, 248 (i.e., the gain is independent of the frequency of the $V_{AMP}$ signal and the resistance of the transistor 234):

$$\text{Gain} \approx \frac{R_C}{R_E} \quad (2)$$

where $R_C$ is the resistance of the resistors 240, 242 and $R_E$ is the resistance of the resistors 246, 248. The same gain may be achieved when signals of very low frequencies pass through the capacitors 230, 232, essentially rendering the capacitors as open connections and removing all connections between the capacitors 230, 232 from the remainder of the LES 225.

In some instances, the source and drain of the transistor 234 may be biased to the same voltage so that the voltage across the drain and source is 0 V. In this situation, the transistor may be in the linear (triode) region. The transistor 234 may thus act as a voltage-variable resistor, with a resistance that is inversely proportional to the degree by which the gate-source voltage exceeds the threshold voltage. In such cases, the transistor 234 may be partially ON, meaning that the resistance of the transistor 234 is between zero and a value that is not substantially greater than 1/wC. For example, if the gate voltage is 1.2 V and the source voltage is greater than 0 V but less than 1.2 V, the transistor 234 may be partially ON. In such cases, the capacitors 230, 232 are now engaged in the LES 225, and they contribute to the gain provided by the LES 225. Accordingly, the gain provided by the LES 225 is a function of the resistances of resistors $R_C$ 240, 242 and $R_E$ 246, 248 as well as the frequency of the signal passing through the capacitors 230, 232 and the resistance $R_{MOS}$ provided by the transistor 234 (which, as explained, is a function of the ambient temperature due to the influence of ambient temperature on the voltage applied to the source 264):

$$\text{Gain} = \frac{R_C}{R_E \| \left( \frac{1}{j\omega c} + \frac{R_{MOS}}{2} \right)} \quad (3)$$

where $R_C$ is the resistance of the resistors 240, 242, $R_E$ is the resistance of the resistors 246, 248, $\omega$ is the frequency of the signal passing through the capacitors 230, 232, C is the capacitance of the capacitors 230, 232, and $R_{MOS}$ is the resistance of the transistor (e.g., the "on" resistance of the transistor). As this gain equation shows, as the frequency of the signals passing through the capacitors 230, 232 increases, the gain increases, and as the frequency decreases, the gain decreases. The degree of gain increase or decrease as a function of frequency may be determined at least in part by the capacitance values of the capacitors 230, 232. Compared to equation (2), the gain expressed in equation (3) includes the impedance provided by the capacitors and the transistor resistance because they are in parallel with the resistors 246, 248 and because the capacitors 230, 232 and the transistor 234 are engaged in the LES 225 circuit.

In some instances, the gate voltage may be substantially higher than the source voltage and, in such cases, the transistor 234 may be fully ON. For example, if the gate voltage is 1.2 V and the source voltage is 0 V, the transistor 234 may be fully ON. In that instance, the gain provided by the LES 225 is a function of the resistances of resistors $R_C$ 240, 242 and $R_E$ 246, 248 as well as the frequency of the signal passing through the capacitors 230, 232:

$$\text{Gain} \approx \frac{R_C}{R_E \| \frac{1}{j\omega c}} \quad (4)$$

where $R_C$ is the resistance of the resistors 240, 242, $R_E$ is the resistance of the resistors 246, 248, $\omega$ is the frequency of the signal passing through the capacitors 230, 232, and C is the capacitance of the capacitors 230, 232. Compared to equation (3), the gain expressed in equation (4) omits the transistor resistance because the transistor 234 is fully ON and this provides a negligible resistance.

If the gate 262 is provided with an OFF signal (e.g., 0 V) to deactivate the temperature-compensated boost functionality of the equalizer circuit 200, the gate-to-source voltage will be either 0 V or lower, meaning that the transistor 234 is fully OFF and the gain provided by the LES 225 is determined by the resistances of $R_C$ 240, 242 and $R_E$ 254, 256 as described in equation (2) above. The BJTs 236, 238 are driven by the differential input signal applied to the bases 258, 260, respectively.

Figure 3:
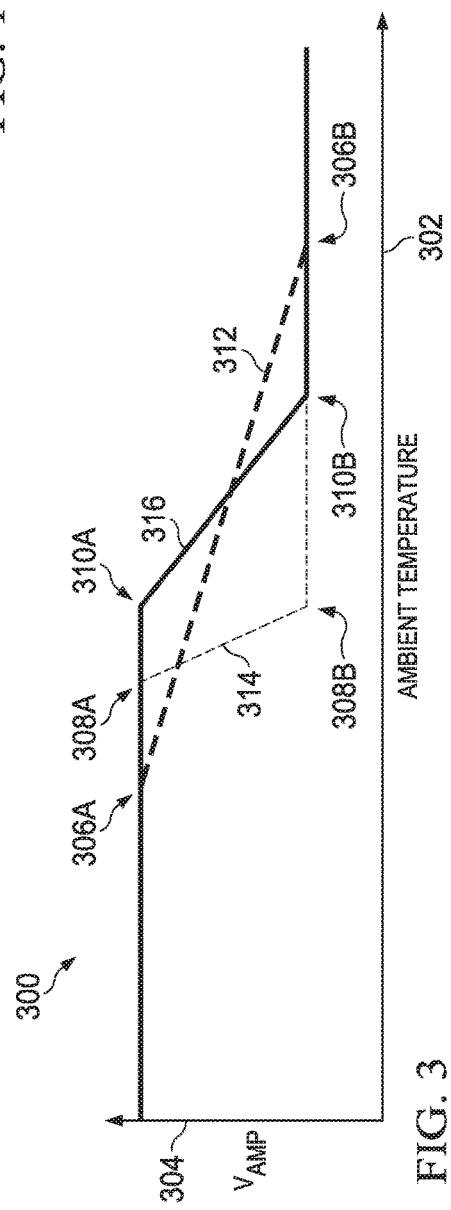
FIG. 3 is a graph depicting an amplified voltage input signal as a function of ambient temperature.

FIG. 3 is a graph 300 depicting an amplified voltage input signal $V_{AMP}$ as a function of ambient temperature. Specifically, the graph 300 depicts ambient temperature on the x-axis 302 and $V_{AMP}$ on the y-axis 304. The graph 300 includes three distinct but partially overlapping curves, each curve determined by a different combination of $V_{REF}$ (node 220 in FIG. 2) and $R_F$ (resistor 218 in FIG. 2). Each curve begins with a relatively high, constant $V_{AMP}$ value as the ambient temperature is low and increases. During this period of constant, high $V_{AMP}$, the voltage provided to the transistor source is relatively high (e.g., 1.2 V). Thus, assuming the transistor gate voltage is high (e.g., 1.2 V), the transistor 234 is OFF, and the gain of the LES 225 is as described above with respect to equation (2). Eventually, a temperature threshold (e.g., thresholds 306A, 308A, 310A) is reached at which the $V_{AMP}$ signal begins to drop. As a result of $V_{AMP}$ dropping, the voltage at the source of the transistor 234 also begins to drop. Assuming the transistor gate voltage is high (e.g., 1.2 V), the transistor 234 is now partially ON, and the gain of the LES 225 is as described above with respect to equation (3). The temperature threshold at which the $V_{AMP}$ begins to drop (and, thus, the transistor 234 turns partially ON) is determined by adjusting the digitally controllable $V_{REF}$ value at node 220. Eventually, an ambient temperature threshold (e.g., thresholds 308B, 310B, 306B) is reached at which the $V_{AMP}$ signal no longer drops and becomes constant (e.g., 0 V). These thresholds may be determined based on the thresholds 306A, 308A, and 310A in combination with the curves' slopes 312, 314, and 316, the slopes being determined based on the digitally controllable resistance of resistor $R_F$ 218.

Figure 4:
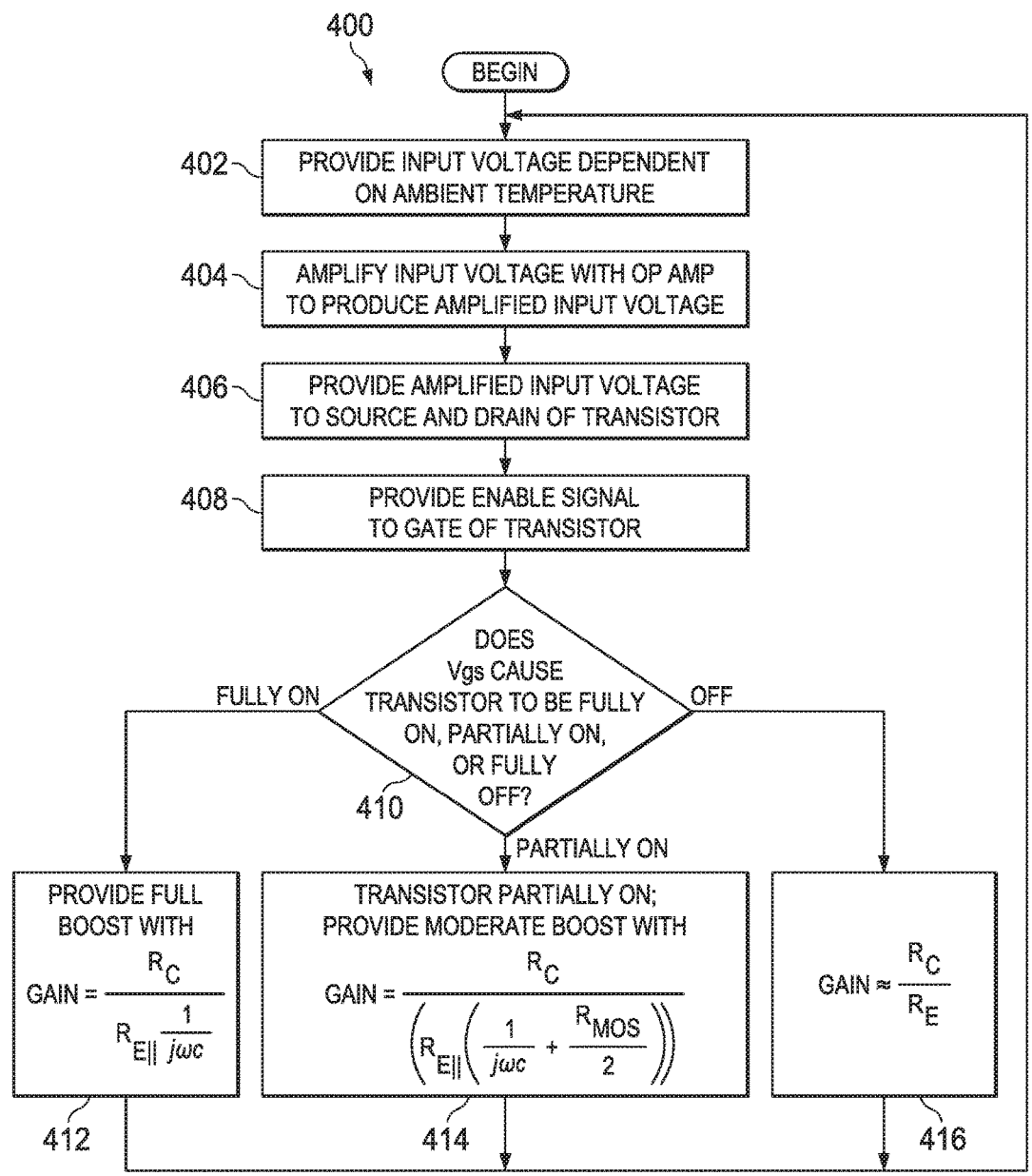
FIG. 4 is a flow diagram of a method in accordance with various embodiments.

FIG. 4 is a flow diagram of a method 400 in accordance with various embodiments. The method 400 begins with providing an input voltage dependent on an ambient temperature (step 402). Referring to FIG. 2, this input voltage is provided to the operational amplifier 222 at node 216. The method 400 next comprises amplifying the input voltage with the operational amplifier to produce an amplified input voltage (step 404). FIG. 2 depicts this amplified input voltage as $V_{AMP}$ on node 224. The method 400 subsequently includes providing the amplified input voltage to the source and drain of the transistor (step 406)—e.g., to the source 264 and drain 266 of the transistor 234. The method 400 also includes providing an ON or OFF enable signal to the gate 262 of the transistor 234 (step 408).

The method 400 comprises determining whether the gate-to-source voltage applied at the transistor 234 causes the transistor 234 to be fully ON, partially ON, or OFF. If the transistor 234 is fully ON, the boost is maximized and the gain is given as in equation (4) above (step 412). If the transistor 234 is partially ON, the boost is moderate and the gain is given by the equation (3) above (step 414). If the transistor 234 is OFF, the gain is determined as indicated in equation (2) above (step 416). After any one of steps 412, 414, and 416 is performed, control of the method 400 returns to step 402. The method 400 may be modified as desired, including by adding, deleting, modifying, or rearranging one or more steps.

The above discussion is meant to be illustrative. Numerous variations and modifications will become apparent to those skilled in the art once the above disclosure is fully appreciated. It is intended that the following claims be interpreted to embrace all such variations and modifications.

What is claimed is:

1. An equalizer, comprising:
   an amplifier configured to produce an amplified voltage signal that is a function of an ambient temperature affecting the equalizer; and
   a linear equalizer stage coupled to the amplifier and comprising a transistor having a resistance controlled by the amplified voltage signal, the linear equalizer stage configured to produce a voltage output signal having a gain that is dependent on the transistor resistance and on a frequency of the amplified voltage signal;
   wherein the amplified voltage signal is provided to a source of the transistor, and wherein a gate of the transistor is digitally controllable.

2. An equalizer, comprising:
   an amplifier configured to produce an amplified voltage signal that is a function of an ambient temperature affecting the equalizer; and
   a linear equalizer stage coupled to the amplifier and comprising a transistor having a resistance controlled by the amplified voltage signal, the linear equalizer stage configured to produce a voltage output signal having a gain that is dependent on the transistor resistance and on a frequency of the amplified voltage signal;
   further comprising a first capacitor coupled to a source of the transistor and a second capacitor coupled to a drain of the transistor.

3. The equalizer of claim 2, further comprising a first bipolar junction transistor (BJT) coupled to the first capacitor via an emitter of the first BJT, and further comprising a second BJT coupled to the second capacitor via another emitter of the second BJT.

4. The equalizer of claim 3, wherein the voltage output signal is produced across the collectors of the first and second BJTs.

5. An equalizer, comprising:
   an amplifier configured to produce an amplified voltage signal that is a function of an ambient temperature affecting the equalizer; and
   a linear equalizer stage coupled to the amplifier and comprising a transistor having a resistance controlled by the amplified voltage signal, the linear equalizer stage configured to produce a voltage output signal having a gain that is dependent on the transistor resistance and on a frequency of the amplified voltage signal;
   wherein, when a gate-to-source voltage between a gate and a source of the transistor is zero, the gain becomes independent of the frequency and the transistor resistance.

6. The equalizer of claim 5, wherein, when the gate-to-source voltage is zero, the gain is a ratio of a first resistor to a second resistor, the first resistor coupled to a collector of a bipolar junction transistor (BJT) and the second resistor coupled to an emitter of the BJT.

7. An equalizer, comprising:
   an amplifier configured to produce an amplified voltage signal that is a function of an ambient temperature affecting the equalizer; and
   a linear equalizer stage coupled to the amplifier and comprising a transistor having a resistance controlled by the amplified voltage signal, the linear equalizer stage configured to produce a voltage output signal having a gain that is dependent on the transistor resistance and on a frequency of the amplified voltage signal;
   wherein, when a gate-to-source voltage between a gate and a source of the transistor is at least a predetermined amount so that the transistor is fully on, the gain becomes independent of the transistor resistance.

8. The equalizer of claim 7, wherein, when the gate-to-source voltage is at least the predetermined amount, the gain is a ratio of:
the resistance of a first resistor coupled to a collector of a bipolar junction transistor in the linear equalizer stage; and
the combination of the resistance of a second resistor coupled to an emitter of the BJT and an impedance of a capacitor coupled to the emitter.

9. An equalizer, comprising:
an operational amplifier having a first input node, a second input node, an output node, and a feedback loop between the output node and the first input node, the first input node comprising a first resistor and receiving a first voltage signal dependent on an ambient temperature affecting the equalizer, the second input node receiving a digitally controllable reference voltage signal, the feedback loop comprising a second resistor having a digitally controllable resistance, and the output node carrying an amplified voltage signal that is a function of the ambient temperature; and
a metal oxide semiconductor field effect transistor (MOSFET) having a digitally controllable gate voltage signal and a source coupled to a first bias resistor and to a first capacitor, the first capacitor coupled to the emitter of a first bipolar junction transistor (BJT), to a first bias current source, and to a third resistor, the MOSFET further comprising a drain coupled to a second bias resistor and to a second capacitor, the second capacitor coupled to the emitter of a second BJT, to a second bias current source, and to a fourth resistor, and wherein collectors of the first and second BJTs couple to fifth and sixth resistors, respectively,
wherein the amplified voltage signal controls a resistance of the MOSFET, and wherein the resistance of the MOSFET affects a gain of the equalizer.

10. The equalizer of claim 9, wherein the MOSFET is an n-type MOSFET.

11. The equalizer of claim 9, wherein, when a gate-to-source voltage between a gate of the MOSFET and the source of the MOSFET is zero, the MOSFET is off and the gain is determined based on resistances of at least one of the third and fourth resistors and based on resistances of at least one of the fifth and sixth resistors.

12. The equalizer of claim 9, wherein, when the MOSFET is fully on, the gain is determined based on resistances of at least one of the third and fourth resistors, on resistances of at least one of the fifth and sixth resistors, and on an impedance provided by at least one of the first and second capacitors in response to the frequency of the amplified voltage signal.

13. The equalizer of claim 9, when the MOSFET is partially on, the gain is determined based on resistances of at least one of the third and fourth resistors, on resistances of at least one of the fifth and sixth resistors, on an impedance provided by at least one of the first and second capacitors in response to the frequency of the amplified voltage signal, and on a resistance of the MOSFET.

14. A method, comprising:
providing an input voltage signal dependent on an ambient temperature;
amplifying the input voltage signal with an operational amplifier to produce an amplified voltage signal;
providing the amplified voltage signal to a source of a metal oxide semiconductor field effect transistor (MOSFET);
providing a gate voltage signal to a gate of the MOSFET;
when the MOSFET is fully on, providing a first gain to the amplified voltage signal that is based on a frequency of the amplified voltage signal;
when the MOSFET is partially on, providing a second gain to the amplified voltage signal that is based on a frequency of the amplified voltage signal and on a resistance of the MOSFET; and
when the MOSFET is off, providing a third gain to the amplified voltage signal that is independent of the frequency of the amplified voltage signal and of the resistance of the MOSFET.

15. The method of claim 14, wherein providing the first and second gains comprises using a first capacitor coupled to the source of the MOSFET and using a second capacitor coupled to a drain of the MOSFET.

16. The method of claim 14, wherein the MOSFET is an n-type MOSFET.

* * * * *